(12) United States Patent
Schmitt

(10) Patent No.: US 8,214,420 B2
(45) Date of Patent: Jul. 3, 2012

(54) METHOD AND DEVICE FOR DIGITIZING AN ANALOGICAL SIGNAL

(75) Inventor: Julien Schmitt, Palaiseau (FR)

(73) Assignee: DIBCOM, Palaiseau (FR)

( * ) Notice: Subject to any disclaimer, the term of this patent is extended or adjusted under 35 U.S.C. 154(b) by 1273 days.

(21) Appl. No.: 11/936,107

(22) Filed: Nov. 7, 2007

(65) Prior Publication Data

US 2008/0172439 A1    Jul. 17, 2008

(30) Foreign Application Priority Data

Nov. 8, 2006  (EP) .................... 06291739

(51) Int. Cl.
*G06G 7/02* (2006.01)

(52) U.S. Cl. ......................................... 708/819

(58) Field of Classification Search .................... 708/819
See application file for complete search history.

(56) References Cited

U.S. PATENT DOCUMENTS 6,590,528 B1 *  7/2003  DeWulf ................. 342/357.63

| | | | |
|---|---|---|---|
| 2004/0185810 A1 | 9/2004 | Kishi | |
| 2006/0111066 A1 | 5/2006 | Thorpe | |

FOREIGN PATENT DOCUMENTS

| | | |
|---|---|---|
| DE | 102005049592 | 5/2006 |
| EP | 1089429 | 4/2001 |
| EP | 1355419 | 10/2003 |

* cited by examiner

*Primary Examiner* — Tan V. Mai
(74) *Attorney, Agent, or Firm* — Young & Thompson

(57) ABSTRACT

This device (10) includes elements (12) for receiving an analogical signal including a data signal in a frequency channel, elements (18) for amplifying the received signal, elements (20) for filtering the amplified signal so as to cut out frequencies outside the frequency channel of the data signal, members (24) for converting the filtered analogical signal into a digital signal, elements (32) for measuring the power ($P_{whole}$) of the whole received signal after amplification and before filtering, and members (26) for determining an amplification control signal for the received signal amplification as a function of the received signal measured power ($P_{whole}$).

17 Claims, 3 Drawing Sheets

METHOD AND DEVICE FOR DIGITIZING AN ANALOGICAL SIGNAL

BACKGROUND OF THE INVENTION

1. Field of the Invention

The present invention relates to a method of digitizing an analogical signal such as a digital television signal, and a corresponding device.

2. Description of the Related Art

Digital television data are generally transmitted to a receiver through an analogical data signal, using a predetermined frequency channel.

The receiver comprises means for processing the received analogical signal before it is converted into a digital data signal by means of an analogical digital converter.

The processing means usually comprises at least a filter, which cuts out the frequencies outside the data channel, frequency translation means, and other processing modules.

It is known to distribute amplifiers within the processing means so as to allow optimal use of the converter, and particularly it is known to place an amplifier before the filter and another amplifier before the converter.

The gains of the amplifiers are automatically controlled by Automatic Gain Control (AGC) means as a function of parameters of the converted digital data signal, usually the power of the digital data signal compared to a fixed reference.

Such receiver is described in FR-A1-2 826 525.

However, in harsh environment, the analogical data signal is mixed up with noise signals.

A noise signal can be either out of the data frequency range, i.e. out of the data channel, and it is referred to as adjacent channel noise, or inside the data frequency range and it is referred to as co-channel noise.

In the prior art receiver, these noise signals are amplified along with the data signal, and therefore lead to saturation of the amplifiers or of the converter.

Therefore it is desirable to develop a new method and a corresponding device that overcome this drawback.

SUMMARY OF THE INVENTION

Accordingly, the invention provides a method of digitizing an analogical signal as described below. Other features of the method are also outlined below.

The invention further provides a device of digitizing an analogical signal as described below. Other features of the device are also outlined below.

BRIEF DESCRIPTION OF THE DRAWING FIGURES

These and other aspects of the invention will be apparent from the following description and drawings upon which:

DETAILED DESCRIPTION OF THE INVENTION

Figure 1:
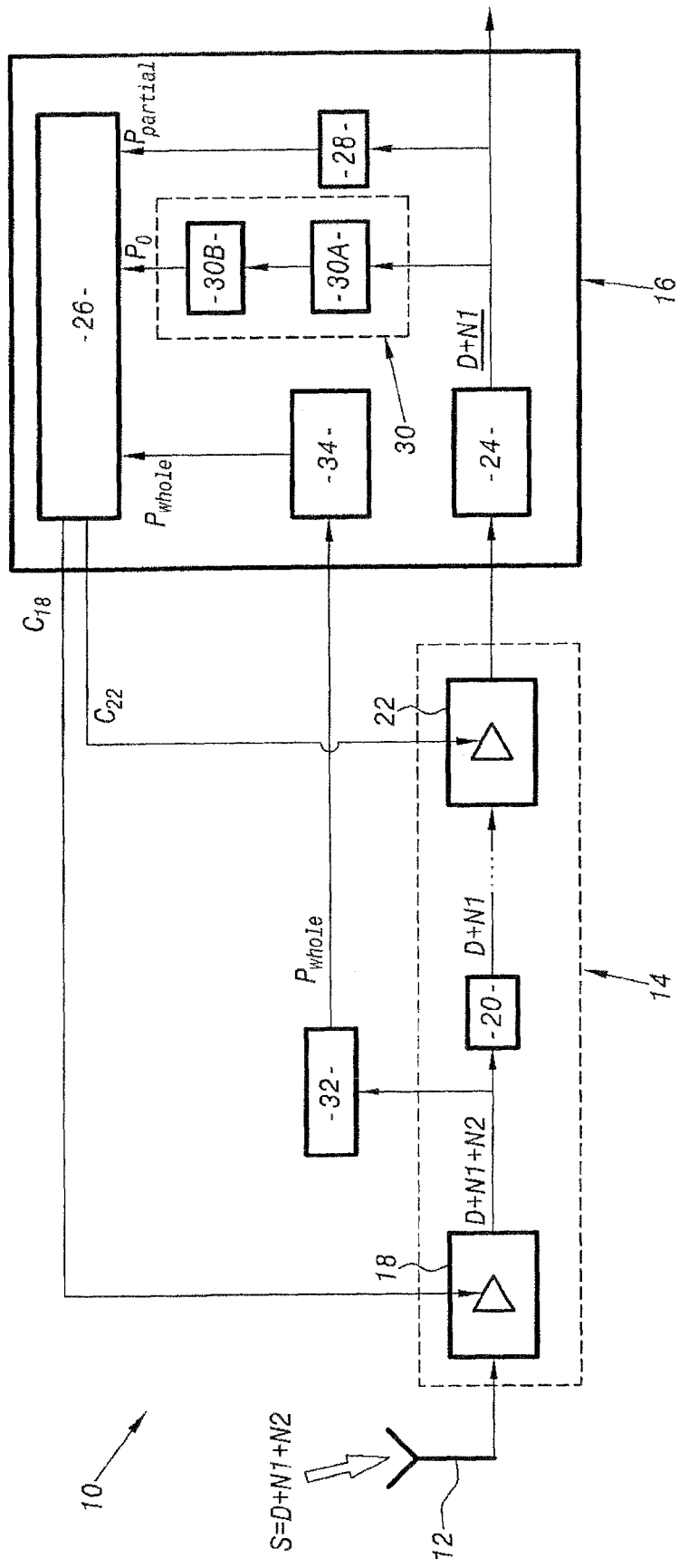
FIG. 1 is a schematic diagram of a receiver according to the present invention.

Referring to FIG. 1, a receiver 10 intended to receive digital television data is illustrated.

This receiver 10 first comprises an antenna 12 for receiving a analogical signal S comprising digital television data coded in a predetermined frequency channel. It further comprises analogical means 14 for processing the received signal S, and a chip 16 connected to the output of the processing means 14.

The analogical processing means 14 comprise a first amplifier 18 receiving the analogical signal S from the antenna 12 and connected to a filter 20 that cuts out the frequencies outside the data frequency channel.

The analogical processing means 14 further comprise, at their output, a second amplifier 22.

The chip 16 comprises a first analogical digital converter 24 connected to the output of the second amplifier 22. The first converter 24 outputs a digital signal that constitutes the output of the receiver 10.

The chip 16 also comprises automatic gain control (AGC) means 26 delivering two control signals C18 and C22 to respectively the first and second amplifier 18 and 22.

The AGC means 26 are able to determine the control signals from the following parameters: the power $P_{partial}$ of the converted digital signal, an estimated optimal power value $P_0$ for $P_{partial}$ ($P_0$ is the value which $P_{partial}$ is expected to tend towards), and the power of the analogical signal S before filtering $P_{whole}$.

In order to determine these parameters, the chip 16 first comprises means 28 for measuring the power $P_{partial}$ of the converted digital signal, and means 30 for computing the estimated optimal power $P_0$ as a function of the amplitude distribution type, defined by a parameter of the amplitude distribution, both connected to the AGC and to the output of converter 24.

In the described embodiment the parameter is a generalized moment, and preferably the generalized first moment. The estimated optimal power computing means thus 30 comprise a first element 30A for computing the generalized first moment of the digital signal, representative of the spread of the signal, i.e. its amplitude distribution also called probability density.

The computation is achieved over a predetermined period of time by use of conventional formulas, for example the square value of the mean of the absolute terms of the signal divided by the power. Advantageously this computation is achieved on a time sliding window.

The estimated optimal power computing means 30 further comprise a second element 30B for estimating the optimal power from the generalized first moment. In other embodiments, higher order of generalized moment could be used.

In the described embodiment, predetermined values of optimal power are stored with their corresponding generalized first moment. The nearest predetermined minimum and maximum values of the generalized moment computed by the first element 30A are detected, and by interpolation, such as a linear interpolation or the like, the corresponding optimal power $P_0$ is computed.

Moreover, the receiver 10 comprises means 32 for measuring in an analogical way the power $P_{whole}$ of the analogical signal S before filtering in filter 20, at the output of the first amplifier 18. They are connected to the AGC means through a second analogical digital converter 34 of the chip 16.

Figure 2:
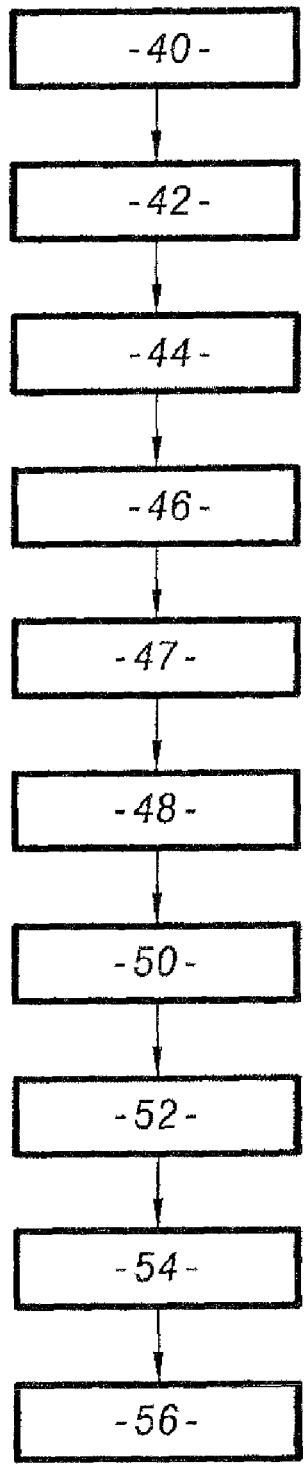
FIG. 2 is a flow chart of a method of digitizing an analogical signal achieved by the receiver of FIG. 1.

With reference to FIGS. 1 and 2, the steps of a method achieved by the receiver 10 is described.

An analogical signal S comprising OFDM or COFDM data signal D and a noise signal N is received by the antenna 12 in a step 40.

In the example, the analogical data signal D carries digital television data. The amplitude distribution type of this data signal D is predetermined and is essentially Gaussian, according to used norms.

The noise signal N comprises a co-channel noise signal N1 and an adjacent channel noise signal N2.

The method further comprises a step 42 of amplification of the received analogical signal S achieved by amplifier 18.

Step 42 is followed by a step 44 of measurement of a first parameter of the received analogical signal S. More precisely, this parameter is the power $P_{whole}$ of the whole received analogical signal S, including the adjacent channel noise signal N2, over a predetermined period of time.

Thereafter, the method continues in a step 46 by filtering by the filter 20 the analogical signal S which removes the adjacent channel noise signal N2.

The method further comprises a step 47 of amplification of the filtered analogical signal D+N1 achieved by amplifier 22.

This is followed in a step 48 by the conversion of the received, amplified and filtered signal by converter 24 into a digital signal D+N1 that comprises the data signal D and the co-channel noise signal N1.

The method continues with computing an estimated optimal power $P_0$, achieved at steps 50 and 52, by corresponding measuring means 30.

In step 50, the spread of the digital signal D+N1 is measured by computing the first generalized moment.

In step 52, the optimal power $P_0$ is estimated by using the measurement of the spread of the digital signal realised at step 50.

The method continues in a step 54 by computing the power $P_{partial}$ of the digital signal D+N1 after conversion by converter 24.

Finally the method comprises a step 56 of determination of the control signals of the amplifiers 18, 22 by way of AGC means 26 as a function of:
  the converted digital signal power $P_{partial}$, as measured in step 54,
  the estimated optimal power $P_0$ determined in step 50 and 52, and
  the whole analogical signal power $P_{whole}$ measured in step 42.

Figure 3:
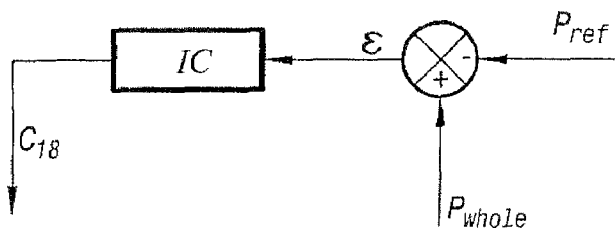
FIGS. 3 and 4 represent functional diagrams for determining control signals according to a first embodiment.
Figure 4:
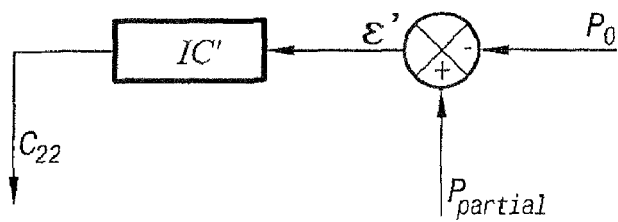

Turning to FIGS. 3 and 4, in a first embodiment, the control signal $C_{18}$ of the first amplifier 18 is determined as a function of $P_{whole}$, and the control signal $C_{22}$ of the second amplifier is determined as a function of $P_{partial}$ and $P_0$.

More precisely, with reference to FIG. 3, the AGC means 26 comprises a first error detector between $P_{whole}$ and a predetermined reference $P_{ref}$. The resulting error $\epsilon$ is then accumulated in a first module IC in order to obtain the control signal $C_{18}$ of the first amplifier 18.

So as to obtain the control signal $C_{22}$ of the second amplifier 22, with reference to FIG. 4, the AGC means 26 comprises a second error dector between $P_{partial}$ and $P_0$. Again, the resulting error $\epsilon'$ is accumulated in a second module IC' that gives $C_{22}$.

Figure 5:
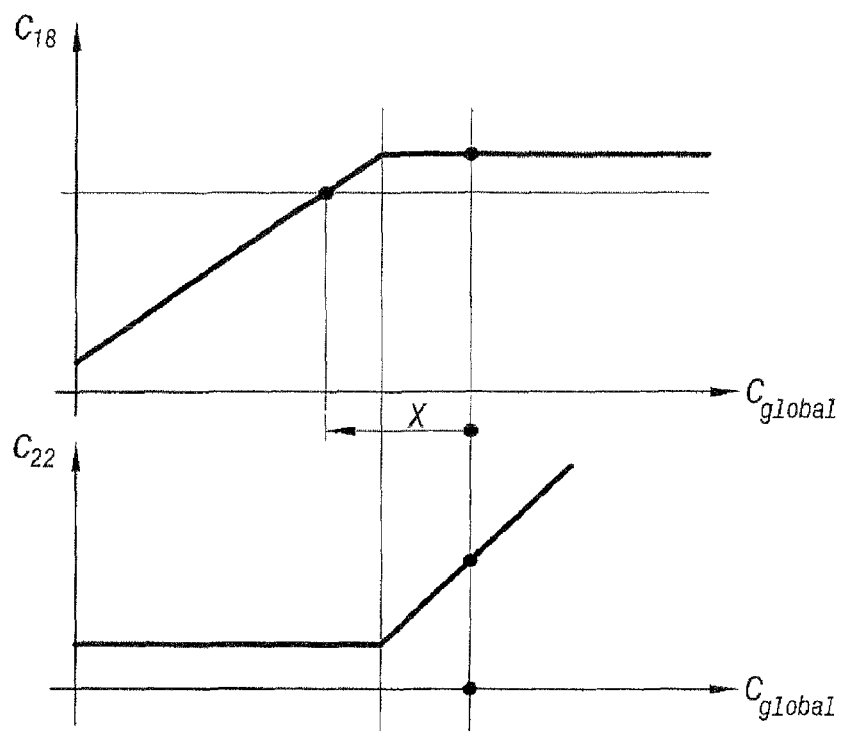
FIG. 5 is a graph for determining control signals according to a second embodiment.

In a second embodiment, a global control signal $C_{global}$ is determined, by accumulating error $\epsilon'$ between $P_{partial}$ and $P_0$, in the same way as $C_{22}$ is determined in the previous embodiment (cf. FIG. 4). The control signals $C_{18}$ and $C_{22}$ are derived from the global control signal $C_{global}$, by using the two graphs illustrated on FIG. 5.

A first graph represents $C_{18}$ while a second graph represents $C_{22}$ both as a function of $C_{global}$. The graphs are traced empirically.

On a first portion of $C_{global}$, $C_{18}$ increases while $C_{22}$ remains constant at a low level. On a second portion of $C_{global}$, $C_{18}$ remains constant at a high level, while $C_{22}$ increases from the low level.

Hence, as $P_{partial}$ decreases, the amplification of the received signal S is first achieved by the first amplifier 18, then by the second amplifier 22.

$C_{22}$ is directly determined from the second graph by using the actual value of $C_{global}$.

$C_{18}$ however is determined from the first graph by using the actual value of $C_{global}$ minus a quantity X being a function of $P_{whole}$. Subtracting the quantity X avoids that $C_{18}$ reaches a high level, which could lead to saturation of the filter 20.

The function between X and $P_{whole}$ is determined by accumulating the error E between $P_{whole}$ and $P_{ref}$, in the same way as $C_{18}$ is determined in the previous embodiment (cf. FIG. 3), such that $C_{18}$ makes amplifier 18 outputting a signal with a power $P_{whole}$ corresponding to a predetermined reference $P_{ref}$.

The described method and device clearly provide several advantages.

First, by using the estimated optimal power of $P_0$ as a reference, the amplitude distribution of the co-channel noise signal N1 is taken into account in the AGC means 26. More precisely, the estimated optimal power $P_0$ will generally be somewhere between the optimal power P1 corresponding to the amplitude distribution of the data signal D alone, and the optimal power P2 corresponding to the amplitude distribution of the co-channel noise signal N1 alone. Using the estimated optimal power $P_0$ leads to optimal conversion of the digital signal D+N1, which can then be processed in digital circuits (not shown) following the chip 16 so as to retrieve D, and then the digital video data.

Moreover, the use of the mean power $P_{whole}$ of the analogical signal S before filtering avoids saturation of the amplifier 18 that could result if the adjacent channel noise signal N2 were not considered.

The device achieving the method of the invention can be a dedicated device or can be integrated in another general device such as a digital television decoder or a digital television set.

The invention claimed is:

1. A method of digitizing an analogical signal comprising a data signal in a frequency channel, comprising the steps of:
  receiving (40, 12) said analogical signal,
  amplifying (42, 18) said received analogical signal to obtain an amplified signal having a power ($P_{whole}$),
  filtering (46, 20) said amplified signal to cut out frequencies outside the frequency channel of the data signal and to obtain a filtered analogical signal,
  converting (48, 24) said filtered analogical signal into a digital signal, said digital signal having a power ($P_{partial}$),
  measuring (44, 32) the power ($P_{whole}$) of the amplified signal, after amplification (42) and before filtering (46),
  determining (56, 26) an amplification control signal ($C_{18}$) for the amplification (42) of the received analogical signal as a function of the power ($P_{whole}$) of the amplified signal,
  amplifying (47, 22) the filtered analogical signal before conversion (48),
  computing (50, 30A) a feature of the received analogical signal representative of an amplitude distribution of the received analogical signal,
  computing (52, 30B) a reference optimal power ($P_0$) of the power ($P_{partial}$) of the digital signal as a function of said feature, and determining (56, 26) an amplification control signal ($C_{22}$) for the amplification (47) of the filtered signal as a function of said reference optimal power ($P_0$).

2. The method according to claim 1, wherein the amplification control signal ($C_{18}$) for the amplification (42) of the analogical signal is determined as a function of the reference optimal power ($P_0$).

3. The method according to claim 2, further comprising the steps of:
   measuring (54, 28) the power ($P_{partial}$) of the digital signal,
   determining (56, 26) the amplification control signal ($C_{22}$) for the amplification (47) of the filtered signal as a function of the reference optimal power ($P_0$) and the power ($P_{partial}$) of the digital signal.

4. The method according to claim 1, wherein the feature of the received signal representative of the amplitude distribution of the received analogical signal is a generalized moment of the digital signal over a period of time, and in that the reference optimal power ($P_0$) is estimated by computation as a function of said generalized moment.

5. The method according to claim 1, further comprising the steps of:
   measuring (54, 28) the power ($P_{partial}$) of the digital signal,
   determining (56, 26) the amplification control signal ($C_{22}$) for the amplification (47) of the filtered signal as a function of the reference optimal power ($P_0$) and the power ($P_{partial}$) of the digital signal.

6. The method according to claim 5,
   wherein the amplification control signals ($C_{18}$, $C_{22}$) for the amplifications (42, 47) of the filtered signal and of the received analogical signal are both determined as a function of:
   the power ($P_{whole}$) of the amplified signal,
   the power ($P_{partial}$) of the digital signal, and
   the reference optimal power ($P_0$).

7. A device for digitizing an analogical signal comprising a data signal in a frequency channel, comprising:
   means (12) for receiving said analogical signal,
   means (18) for amplifying said received analogical signal to obtain an amplified signal having a power ($P_{whole}$),
   means (20) for filtering said amplified signal to cut out frequencies outside the frequency channel of the data signal and to obtain a filtered analogical signal,
   means (24) for converting said filtered analogical signal into a digital signal having a power ($P_{partial}$),
   means for measuring (32) the power ($P_{whole}$) of the amplified signal after amplification and before filtering,
   means (26) for determining an amplification control signal ($C_{18}$) for the amplification of the received analogical signal as a function of the power ($P_{whole}$) of the amplified signal, and
   means (22) for amplifying the filtered analogical signal before conversion,
   means (30A) for computing a feature of the received analogical signal representative of an amplitude distribution type of the received analogical signal,
   means (30B) for computing a reference optimal power ($P_0$) of the power ($P_{partial}$) of the digital signal as a function of the feature representative of the computed amplitude distribution of the received analogical signal, and
   means (26) for determining an amplification control signal ($C_{22}$) for the amplification of the filtered analogical signal as a function of the reference optimal power ($P_0$) of the power ($P_{partial}$) of the digital signal.

8. The device according to claim 7, further comprising means (26) for determining the amplification control signal for the amplification of the received signal as a function of the power ($P_{whole}$) of the amplified signal and a predetermined reference ($P_{ref}$).

9. The device according to claim 8:
   means (28) for measuring the power ($P_{partial}$) of the digital signal,
   means (26) for determining the amplification control signal ($C_{22}$) for the amplification (47) of the filtered signal as a function of the measured digital signal power ($P_{partial}$) and computed reference optimal power ($P_0$).

10. The device according to claim 7, further comprising:
    means (30A) for computing a generalized moment of the digital signal over a period of time, and
    means (30B) for computing the reference optimal power ($P_0$) as a function of said computed generalized moment.

11. The device according to claim 7, further comprising:
    means (28) for measuring the power ($P_{partial}$) of the digital signal,
    means (26) for determining the amplification control signal ($C_{22}$) for the amplification of the filtered analogical signal as a function of the power ($P_{partial}$) of the digital signal and the reference optimal power ($P_0$).

12. The device according to claim 11, further comprising:
    means (30B) for estimating a reference optimal power ($P_0$),
    means (28) for measuring the power ($P_{partial}$) of the converted signal, and
    means (26) for determining both the amplification control signals of the amplification of the received analogical signal and the amplification of the filtered analogical signal as a function of:
    the power ($P_{whole}$) of the received signal,
    the power ($P_{partial}$) of the converted signal, and
    the computed reference optimal power ($P_0$).

13. A device for digitizing an analogical signal comprising a data signal in a frequency channel, comprising:
    a receiving unit to receive said analogical signal;
    a first amplifier to amplify said received analogical signal to an amplified signal having a power ($P_{whole}$);
    a filter to filter said amplified signal to cut out frequencies outside the frequency channel of the data signal to obtain a filtered analogical signal;
    a converter to convert said filtered analogical signal into a digital signal having power ($P_{partial}$);
    a measuring unit to measure the power ($P_{whole}$) of the amplified signal after amplification and before filtering;
    a determining unit to determine an amplification control signal ($C_{18}$) to control the amplification of the received analogical signal as a function of the power ($P_{whole}$) of the amplified signal;
    a second amplifier to amplify the filtered analogical signal before the conversion of said filtered analogical signal; and
    a computing unit to compute an amplitude distribution type of the received analogical signal and to compute a reference optimal power ($P_0$) of the power ($P_{partial}$) of the digital signal as a function of the computed amplitude distribution type of the received analogical signal,
    wherein said determining unit determines an amplification control signal ($C_{22}$) for the amplification of the filtered analogical signal as a function of the reference optimal power ($P_0$) of the power ($P_{partial}$) of the digital signal.

14. The device according to claim 13, wherein the determining unit determines the amplification control signal to amplify the received signal as a function of the power ($P_{whole}$) of the amplified signal and a predetermined reference ($P_{ref}$).

15. The device according to claim 13, wherein said computing unit computes a generalized moment of the digital signal over a period of time and computes the reference optimal power ($P_0$) as a function of said computed generalized moment.

16. The device according to claim 13, further comprising a second measuring unit to measure the power ($P_{partial}$) of the digital signal, wherein the determining unit determines the amplification control signal ($C_{22}$) to amplify the filtered analogical signal as a function of the power ($P_{partial}$) of the digital signal and the reference optimal power ($P_0$).

17. The device according to claim 16, further comprising: an estimating unit to estimate a reference optimal power ($P_0$) wherein the second measuring unit measures the power ($P_{partial}$) of the converted signal, and the determining unit determines both the amplification control signals to amplify the analogical signal and the filtered analogical signal as a function of the power ($P_{whole}$) of the received signal, the power ($P_{partial}$) of the converted signal, and the computed reference optimal power ($P_0$).

* * * * *